United States Patent
Kimura et al.

(10) Patent No.: US 6,850,625 B2
(45) Date of Patent: Feb. 1, 2005

(54) INFORMATION STORAGE METHOD, INFORMATION STORAGE DEVICE AND RECORDING MEDIUM

(75) Inventors: Hitoshi Kimura, Kanagawa (JP); Shoji Kanamaru, Tokyo (JP)

(73) Assignee: Sony Corporation, Tokyo (JP)

( * ) Notice: Subject to any disclaimer, the term of this patent is extended or adjusted under 35 U.S.C. 154(b) by 548 days.

(21) Appl. No.: 09/777,416

(22) Filed: Feb. 6, 2001

(65) Prior Publication Data

US 2001/0022770 A1 Sep. 20, 2001

(30) Foreign Application Priority Data

Feb. 7, 2000 (JP) ......................................... 2000-034360

(51) Int. Cl.⁷ ................................................. G06K 9/00
(52) U.S. Cl. ................. 382/100; 382/305; 369/109.01; 711/4
(58) Field of Search ................................. 382/100, 103, 382/106, 107, 280, 168, 172, 177, 201, 253, 270, 305, 285, 156, 166, 255; 369/13.01, 120, 109.01, 110.01, 30.38, 44.33, 30, 13.32, 100, 13.11, 13.35; 711/4, 112, 105; 365/127, 120, 130, 131; 348/154, 169; 356/27; 705/53

(56) References Cited

U.S. PATENT DOCUMENTS

| | | | | |
|---|---|---|---|---|
| 4,551,819 A | * | 11/1985 | Michl et al. | ................. 365/120 |
| 4,864,537 A | * | 9/1989 | Michl et al. | ................. 365/127 |
| 5,177,732 A | * | 1/1993 | Lee et al. | .................... 369/100 |
| 5,247,575 A | * | 9/1993 | Sprague et al. | ............... 705/53 |
| 5,995,474 A | * | 11/1999 | Shimano et al. | ......... 369/13.32 |
| 6,392,914 B1 | * | 5/2002 | Kuroki et al. | ............... 365/118 |
| 6,510,112 B1 | * | 1/2003 | Sakamoto et al. | ....... 369/44.35 |
| 6,609,175 B1 | * | 8/2003 | Ando et al. | ................. 711/112 |

* cited by examiner

Primary Examiner—Bhavesh M. Mehta
Assistant Examiner—Seyed Azarian
(74) Attorney, Agent, or Firm—Frommer Lawrence & Haug LLP; William S. Frommer; Darren M. Simon

(57) ABSTRACT

Information to be stored is input to a plurality of information carrier storage means that interact with each other. A unit amount of information carriers is added to a position selected from the information carrier storage means, and nonlinear diffusion of information carriers is executed from the selected information carrier storage means to its neighboring information carrier storage means, and at the same time, nonlinear dissipation is executed from the information carrier storage means. At that time, the dissipation amount is determined so that the amount adding the difference between the amount of addition and the amount of dissipation to the input representation does not exceed a predetermined threshold value. When equilibrium is confirmed as a result of judgement whether changes in amount of information carriers of each information carrier storage means has become small or not, the amount of information carriers stored in the information carrier storage means is output as a numerical value.

34 Claims, 7 Drawing Sheets

INFORMATION STORAGE METHOD, INFORMATION STORAGE DEVICE AND RECORDING MEDIUM

BACKGROUND OF THE INVENTION

1. Field of the Invention

This invention relates to an information storage method, information storage device and information recording medium having recorded an information storage program, which are suitable for application to storage of images, for example.

2. Description of the Related Art

There are kinds of semiconductor memory like static RAM and dynamic RAM, for example, as storage devices. These types of semiconductor memory regularly holds initial information.

Static RAM, however, requires at least four transistors to make up a memory cell for holding initial information, which increases the size of the memory cell, and it is disadvantageous for enhancing integration density. Dynamic RAM has the drawback that it must be refreshed using an external circuit for holding initial information.

OBJECT AND SUMMARY OF THE INVENTION

It is therefore an object of the invention to provide an information storage method and an information storage device capable of periodically reproducing initial information without regularly holding the initial information and advantageous for high density storage, as well as a recording medium having recorded of such an information storage program and allowing it to be read by a computer.

According to the first aspect of the invention, there is provided an information storage method comprising:

a first step of inputting information to be stored; and a second step of autonomically and periodically reproduce representation of said information input in the first step after the representation of the information once changes with a disturbance.

According to the second aspect of the invention, there is provided an information storage device comprising a function of autonomically and periodically reproducing representation of input information after the representation of the information once changes due to a disturbance.

According to the third aspect of the invention, there is provided an information storage device having the function of reproducing representation of input information autonomically and periodically after the representation of the information once changes due to a disturbance, comprising:

input means supplied with data expressed by n-dimensional vectors (where n is a natural number);

storage means made up of n pieces of information carrier storage means for storing data input to the input means;

control means for adding a predetermined amount of information carriers to data stored in said storage means, diffusing a predetermined amount of information carriers and dissipating a predetermined amount of information carriers;

random number generator for generating a random number and send it to said controller;

judging means for judging whether the change in amount of information carriers in each information carrier storage means has become below a predetermined value or not; and output means for outputting a result of arithmetic operation by the controller.

In the present invention, the information to be stored is typically input to a plurality of information carrier storage means that interact with each other. More specifically, information carriers expressed by n-dimensional vectors (where n is a natural number) are input as information to n pieces of information carrier storage means distributed in an m-dimensional space (where m is a natural number) and functioning to hold information carriers of a real number value. The interaction among different information carrier storage means typically includes nonlinear diffusion and dissipation, more particularly, nonlinear dissipation. Reproducibility of representation of the information is controlled by adjusting the place and amount of dissipation.

Disturbance may be, for example, random addition (or supply) of information carriers, but need not be random. Preferably, disturbance is permutational addition of information carriers. Disturbance may be such that evenness of integral values of added amounts of information carriers appears periodically.

To ensure reproduction of input information, it is important that the total resulting from addition of a difference between the amount of disturbance and the amount of dissipation to representation of the information does not exceed a predetermined threshold value.

In the present invention, the second step typically includes a step of: adding a predetermined amount of information carrier to the information carrier storage means; having a predetermined amount of information carrier diffused among a predetermined set of different information carrier storage means; having a predetermined amount of information carrier dissipated from the information carrier storage means; and having the diffusion and the dissipation repeated until the amount of information carrier of each information carrier storage means reaches an equilibrium state. Further, the storage step typically includes a step of having each information carrier storage means to diffuse information carriers to neighboring information carrier storage means.

In the present invention, the information carrier contains both discrete and continuous ones. Geometric distribution of n pieces of information carrier storage means in the m-dimensional space is basically any pattern, either regular or irregular. The numbers m and n may be basically any natural numbers, but m is typically not larger than 3.

According to the invention having the above-summarized construction, representation of input information is autonomically and periodically reproduced after the representation of the information once changes due to a disturbance. Therefore, it is not necessary to regularly hold initial information unlike conventional semiconductor memory.

The above, and other, objects, features and advantage of the present invention will become readily apparent from the following detailed description thereof which is to be read in connection with the accompanying drawings.

DETAILED DESCRIPTION OF THE PREFERRED EMBODIMENT

An embodiment of the invention will be explained below with reference to the drawings.

Figure 1:
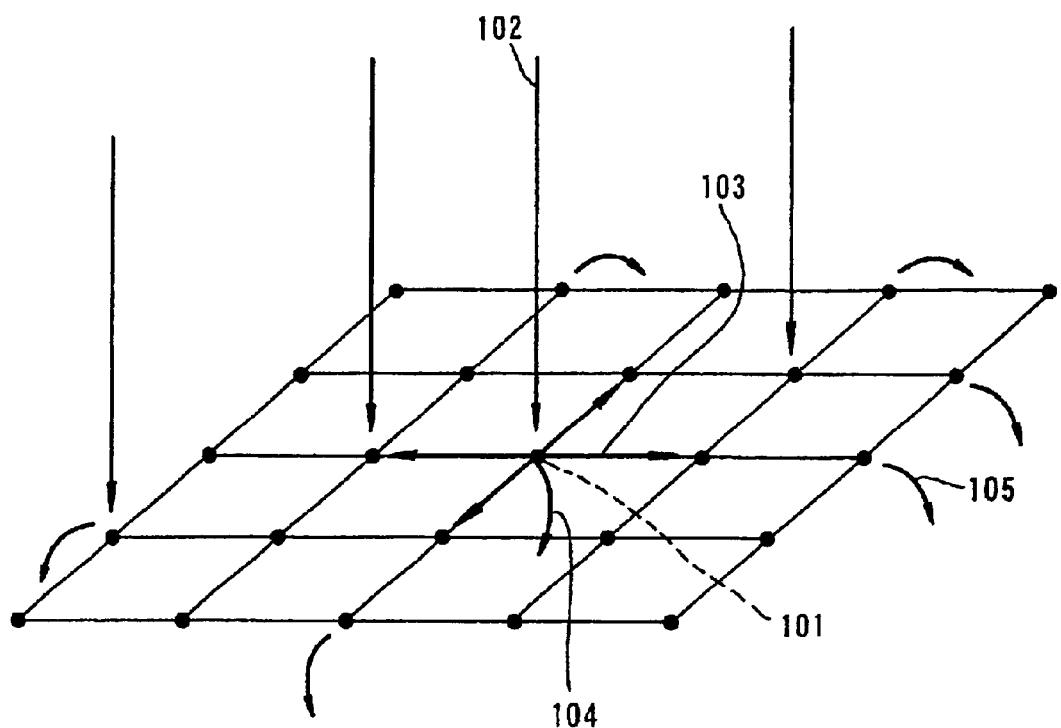
FIG. 1 is a schematic diagram that shows configuration of a storage means of an information storage device in an embodiment of the invention.

FIG. 1 illustrates an information storage device according to the embodiment of the invention, and particularly shows its storage means. In FIG. 1, reference numeral 101 denotes information carrier storage means (storage primary unit), 102 denotes random addition of information carriers, 103 denotes nonlinear diffusion, and 104 and 105 denote nonlinear dissipation.

The information carrier storage means 101 spread in form of square lattice on a two-dimensional space, and four information carrier storage means are located near each information carrier storage means 101. In this case, these information carrier storage means 101 form a matrix of 128 columns and 128 rows. The information carrier storage means 101 may be, for example, semiconductor elements such as quantum dots, nonlinear optical materials, or the like, or may be storage nodes of an electronic circuit, for example.

Random addition of information carriers 102 may be either circumferential noise or artificial noise, but it is preferably permutational noise.

In this case, time development of the system containing the information carrier addition 102, nonlinear diffusion 103 and nonlinear dissipation 104 and 105 is expressed by:

$$\Delta z(r, t) = R(r, t) + D\left[\sum_{nn} f[z_{nn}(r, t)] - \sum_{nn} f[z(r, t)]\right] - D' f[z(r, t)] \quad (1)$$

and $$f[z(r, t)] = 1 + \frac{1}{1 + \exp[-\beta\{z(r, t) - z_0\}]} \quad (2)$$

Figure 2:
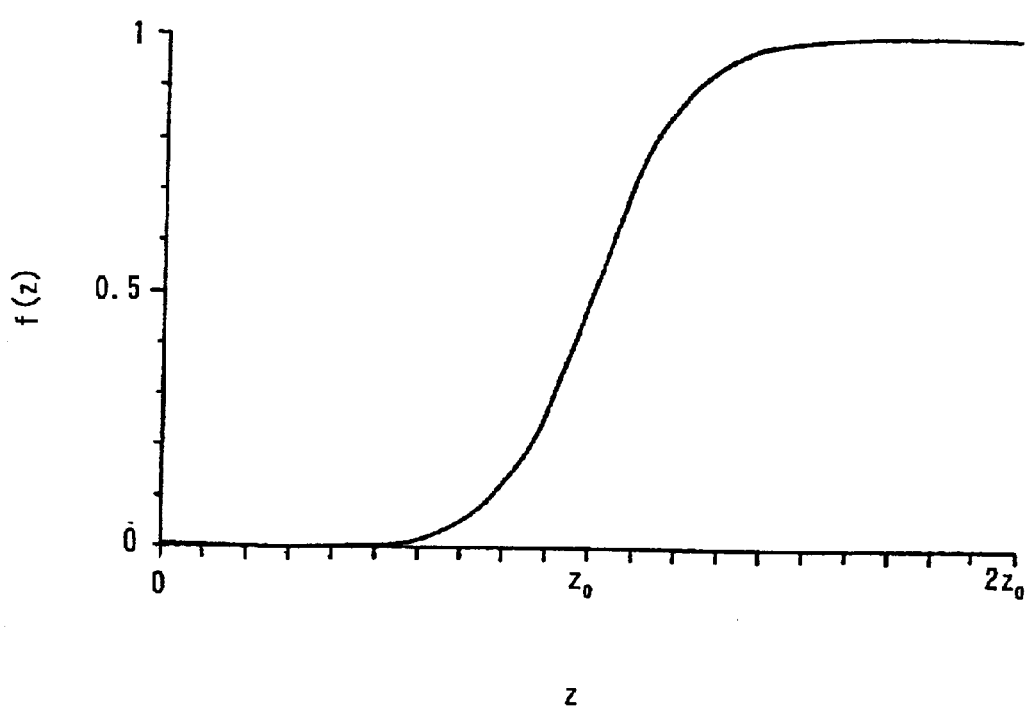
FIG. 2 is a schematic diagram that shows a sigmoid function used in an information converting method according to the embodiment of the invention.

In Equations (1) and (2), r is the spatial coordinates (site) of the information carrier storage means, t is the time, $z(r, t)$ is the amount of information carriers stored in the information carrier storage means corresponding to the site r and the time t, $R(r, t)$ is the function representing the added amount of information carriers, D is the coefficient of diffusion, $f(z(r, t))$ is the function defined by Equation (2), D' is the coefficient of dissipation, $z_0$ is a predetermined threshold value, and $\beta$ is a constant determining the magnitude of nonlinear diffusion and nonlinear dissipation of information carriers. Equation (1) represents displacement of the value $z(r, t)$ in the site r, the first term of the right side represents the random information carrier addition 102, the second term represents the nonlinear diffusion 103, and the third term represents the nonlinear dissipation 104 and 105. "nn" of $z_{nn}$ in the second term of the right side of Equation (1) represents nearest sites (nearest neighbors), and $\Sigma$ is the sum for all nearest neighbors. Equation (2) represents a function that gently changes from 0 to 1 near the threshold value $z_0$, which is as shown in FIG. 2.

Nonlinear dissipation 104 is dissipation from all information carrier storage means 101 whereas nonlinear dissipation 105 is dissipation from the information carrier storage means 101 located at boundaries.

Figure 3:
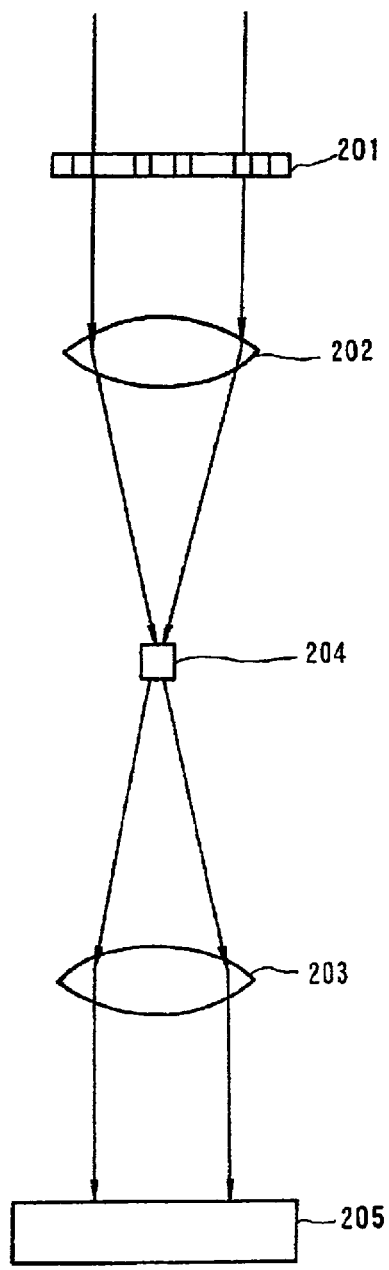
FIG. 3 is a schematic diagram that shows an example of system that performs write and read with the information storage device according to the embodiment of the invention.

FIG. 3 shows an example of system for writing and reading information to or from the information storage device according to the first embodiment. In FIG. 3, reference numeral 201 denotes an input information filter, 202 and 203 denote lenses, 204 denotes the information storage device according to the first embodiment, and 205 denotes an information detector. In this system, when data is input (written) in the information storage device 204, information to be input is optically introduced to the information storage device 204 through the input information filter 201 and the lens 202. The input information filter 201 is composed of a transmission type liquid crystal device, for example, and has the function of converting information input from an external electronic circuit, for example, into a two-dimensional information pattern. When data is output (read out), the input information filter 201 is turned OFF to permit the input light to pass through such that the read-out light is directly incident onto the information storage device 204. The information storage device 204 preliminarily modulates the read-out light in response to the input information. Then, the modulated light is incident to the information detector 205 through the lens 203 and detected there.

Figure 4:
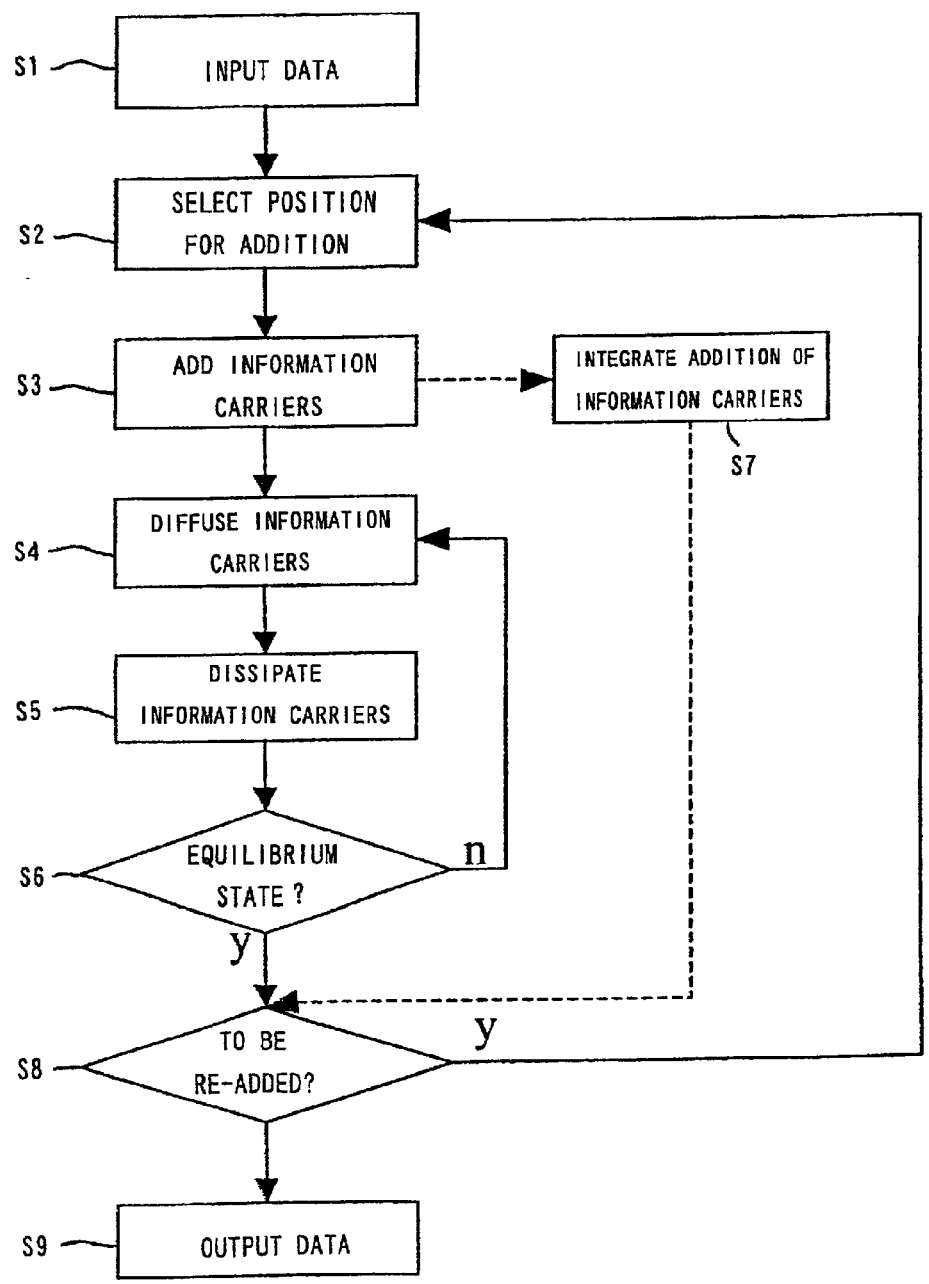
FIG. 4 is a flow chart that shows the information storage method according to the embodiment of the invention.

Next explained is an information storage method according to the first embodiment. FIG. 4 is a flow chart that shows an example of information storage method.

Referring to the flow chart of FIG. 4, first in the step S1, information carriers expressed by 16384-dimensional vectors are input to 128×128=16384 pieces of information carrier storage means 101 distributed on a two-dimensional space.

In step S2, one of these 16384 information carrier storage means 101 is selected. The position to be selected is determined at random. Let the information carrier storage means labeled with numeral 101 in FIG. 1 be selected here.

In step S3, a unit amount of information carriers is added to the selected information carrier storage means 101. In FIG. 1, numeral 102 indicates information carrier addition of this unit amount.

In step S4, information carriers are diffused non-linearly from the selected information carrier storage means 101 to four information storage means located near it. In FIG. 1, reference numeral 103 indicates this nonlinear diffusion of information carriers.

In step S5, information carriers are dissipated from the information carrier storage means 101. For example, when $\beta$ of Equation (2) takes a sufficiently large value, the dissipation amount is determined such that the value adding the difference between the added amount (supplied amount) and the dissipation amount to the input representation does not exceed a predetermined threshold value. More specifically, the dissipation amount is determined to satisfy Equation (3) given later.

In step S6, after through steps S4 and S5, it is judged whether the change in amount of information carriers of each information carrier storage means 101 has become small or not. In this embodiment, judgment is conducted relying on whether the largest of values of changing amounts of information carriers of respective information carrier storage means 101 has decreased to below 0.001 or not. Of course, this value may be smaller than 0.001. The value of the largest of the values of changing amounts of information carriers is 0.001 or larger, it is regarded as not reaching a balanced condition, and the control returns to step S4 to repeat diffusion (step S4) and dissipation (step S5). When the value is below 0.001, it is regarded as having reached a balanced condition, the control progresses to step S8.

In step S7, information carrier addition is integrated.

In step S8, if the addition integration obtained in step S7 is not even, the flow returns to step S2 to execute judgment for addition.

In step S9, the amount of information carriers stored in each information carrier storage means 101 having reached the equilibrium state in step S6 is output as a numerical value. At that time, threshold value processing may be performed and this amount of information carriers may be output in form of a natural number.

Explained here are conditions for reproduction of the input pattern.

In the case where the information is expressed by a binary pattern, the input pattern is periodically reproduced when the amount of nonlinear dissipation $D'f[z(r, t)]$ takes the value satisfying:

$$D'f[z(r,t)] > z(r,t) + R(r,t) - \text{Threshold} \qquad (3)$$

"Threshold" in this equation represents a predetermined threshold value. This is from the following reason.

That is, in the case where diffusion/dissipation occurs in a certain site, with the value $z(r, t)$ exceeding the threshold value, if diffusion/dissipation never occurs again before the next supply occurs in the system, relative positional distribution of $z(r, t)$ is maintained when the supply is uniform, and the initial input pattern is reproduced periodically. That is, in the case where $R(r, t)$ of the first term of the right side of Equation (1) is expressed as "supply" and the nonlinear diffusion of the second term is expressed as "diffusion", if the supply occurs in a certain site and diffusion/dissipation occurs accordingly, the following relation stands.

$$z(r, t) + \text{supply} > \text{Threshold}$$

When the value in the site again becomes high due to returns from neighboring sites, that is, unless $z(r, t)$ exceeds the threshold value after two-step time development, diffusion/dissipation does not occur any more.

Step 1

$$z(r, t+1) = z(r, t) + \text{supply} - \text{diffusion} - \text{dissipation}$$

Step 2

$$z(r, t+2) = z(r, t+1) + \text{diffusion}$$

$$= z(r, t) + \text{supply} - \text{dissipation}$$

where "dissipation" represents the third term of the right side of Equation (1).

Two steps later after the site having a high value receives a supply, the condition becomes such that it takes a value smaller than the threshold value. As a result, $$z(r, t+2) < \text{Threshold}$$

Therefore, $$z(r, t) + \text{supply} - \text{dissipation} < \text{Threshold}$$

Then, it is sufficient to satisfy the relation $$\text{dissipation} > z(r,t) + \text{supply} - \text{Threshold}$$

In this equation, if "dissipation" id replaced by $D'f[z(r, t)]$ and "supply" is replaced by $R(r, t)$, then it becomes Equation (3).

The foregoing condition is the condition necessary for a binary, i.e. two-tone, input patter to be reproduced. Next explained is the condition required for a multi-tone input pattern to be reproduced.

In order that falling occurs in all sites of an N-tone input pattern, the N−1 supply is necessary in all sites. Additionally, it is conditional that falling occurs only once in all sites through all the supply. Then, the following relation is established:

$$\text{dissipation} > z(r, t) - \text{Threshold} + \text{supply}(N-1)$$

In case of two tones, N=2. Therefore, this equation is the same as Equation (3). In case of N tones, since (N−1) is multiplied to the amount of supply, the dissipation amount results in increasing so much.

Figure 5:
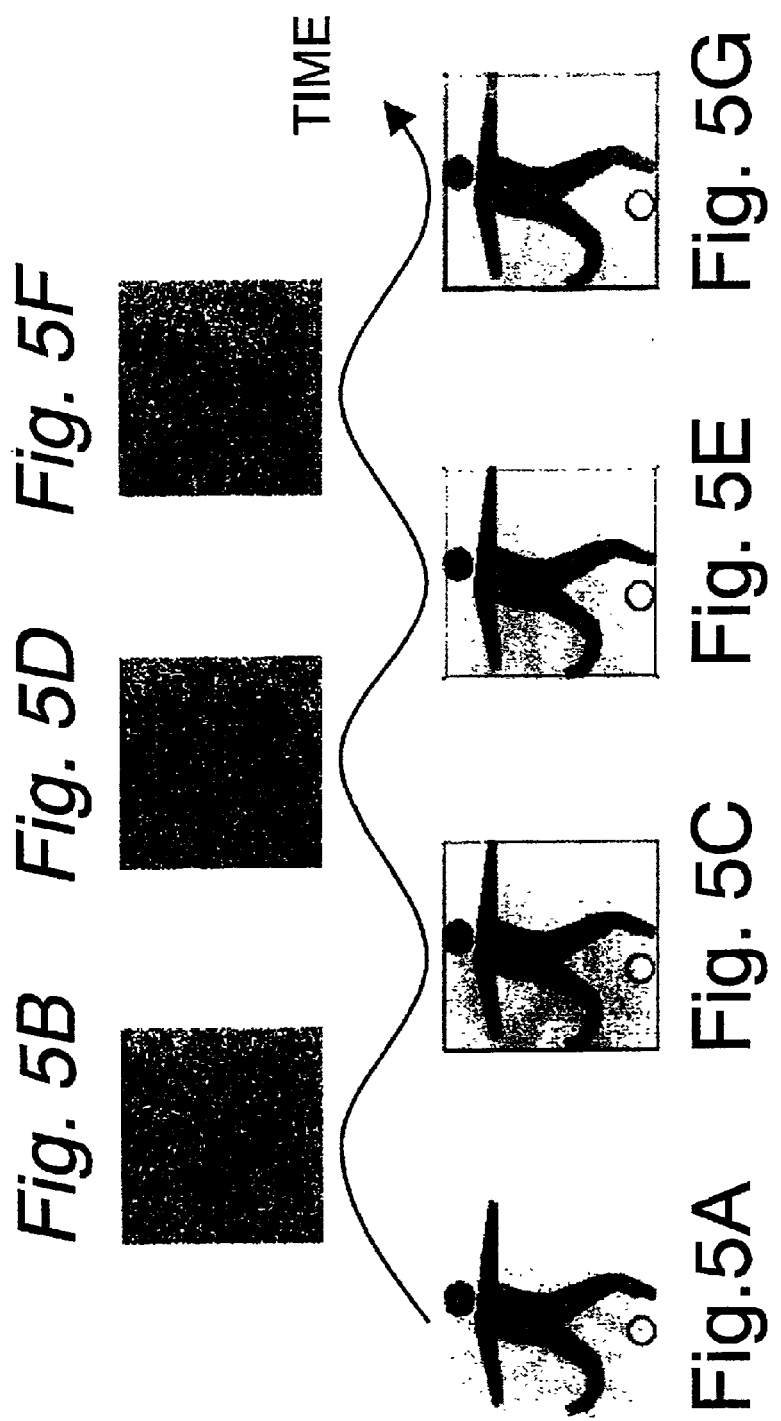
FIG. 5 is a schematic diagram that shows an example of simulation result of the information storage method according to the embodiment of the invention.
Figure 6:
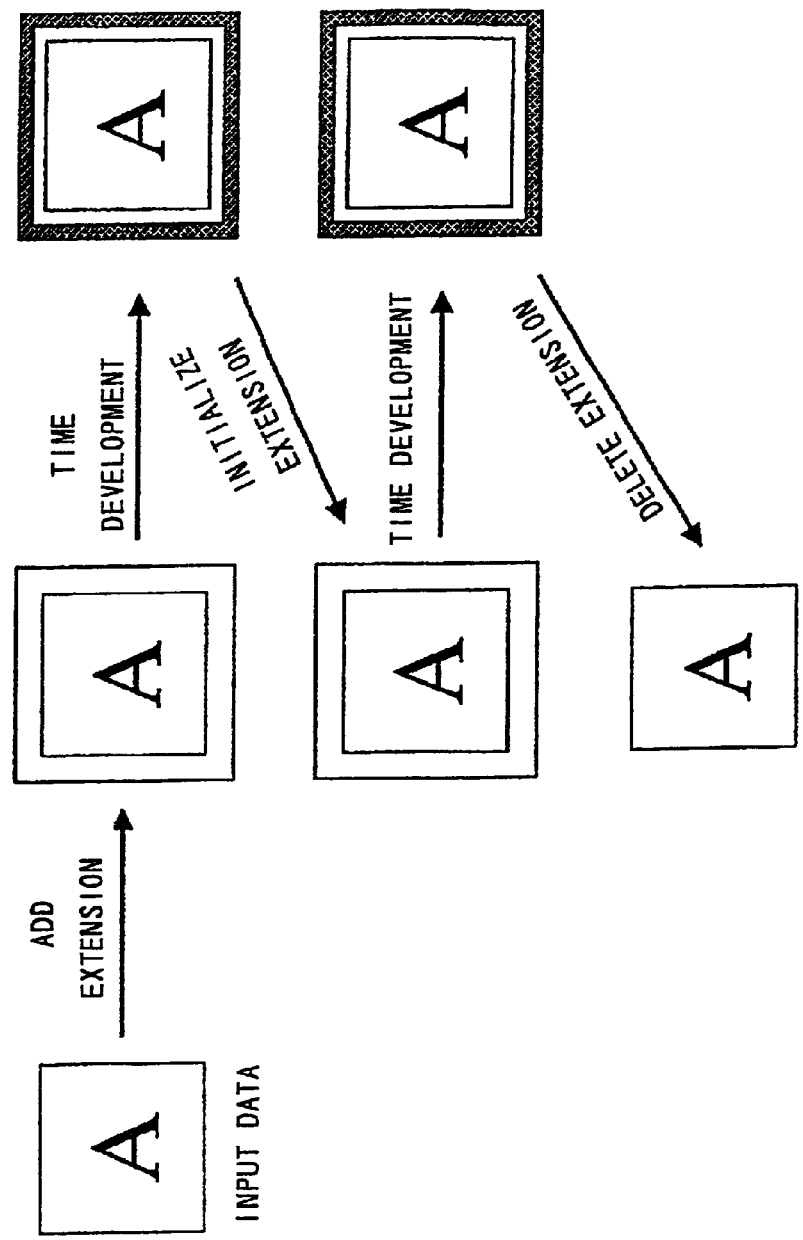
FIG. 6 is a schematic diagram for explaining the method of removing a frame pattern in the information storage method according to the embodiment of the invention.

FIG. 5 shows a result of simulation of the information storage method according to the embodiment.

It will be appreciated from FIG. 5 that the initial input pattern (FIG. 5A) is once lost due to a disturbance, i.e. random information carrier addition (FIG. 5B) and, thereafter, the input pattern is autonomically, periodically reproduced (FIGS. 5C through 5G). In this case, the input pattern (FIG. 5A) is expressed by two values of 3 (black portion) and 4 (gray portion). The threshold is set near 4.5. A site having the value of 4 receives a supply. When it receives the value 5, only 4 of it diffuse to nearest four sites, and only 1 dissipates, resulting in the value being 0 in that site. Since it receives diffusion also from four neighboring sites until the supply becomes even, the value of the site finally returns to the initial value 4. A site having the value 3 becomes 4 even with a supply, and does not bring about diffusion/dissipation. When the value further increases by 1 due to diffusion from neighboring sites, it becomes the value 5, and bring about diffusion/dissipation to result in the value 0.

Thereafter, it receives diffusion from the remainder three neighboring sites until the supply becomes even, and it finally returns to the initial value 3.

Next explained is removal of a frame pattern that occurs after reproduction of the input pattern. That is, it will be appreciated by careful observation of peripheral edges of the patterns shown in FIGS. 5C, 5C and 5G that, along with time development, a frame pattern remains in the peripheral portion even when the initial pattern is substantially reproduced. As the time development further continues, this frame pattern also grows. This is undesirable from the standpoint of reproduction of the initial pattern. Since this frame pattern is produced by nonlinear dissipation 105 from boundaries of FIG. 1, it is necessary to take a procedure for removing influences of the boundaries. Next explained is a procedure for this purpose.

The first method employs a periodical boundary condition. That is, by employing periodical boundaries, all sites have the same condition, and no frame pattern is produced. However, although it is possible by simulation, for realizing an actual device, it will be necessary to place it on a spherical plane, for example.

The second method decreases makes dissipation from boundaries relatively small. That is, although dissipation occurs from respective sites and from boundaries externally by diffusion, dissipation from boundaries will decrease relatively if dissipation from respective sites is increased, and the influence of the boundaries to the time development of the pattern will be decreased. Further, by preventing (zeroing) dissipation of external diffusion from boundaries, no frame-like patterns are produced from boundaries, and the initial pattern can be reproduced completely.

The third method adds an extension around the initial pattern and deletes it after time development. That is, an extension of a constant value is previously added around the initial pattern and developed with time. At the point where the supply becomes even and the initial pattern is reproduced, a frame pattern exists in the extension. However, by again initializing the extension and progressing the next time development, influences of the frame pattern can be removed. The final data is output after removal of the extension. An example where the input pattern is "A" is shown in FIG. 7.

Figure 7:
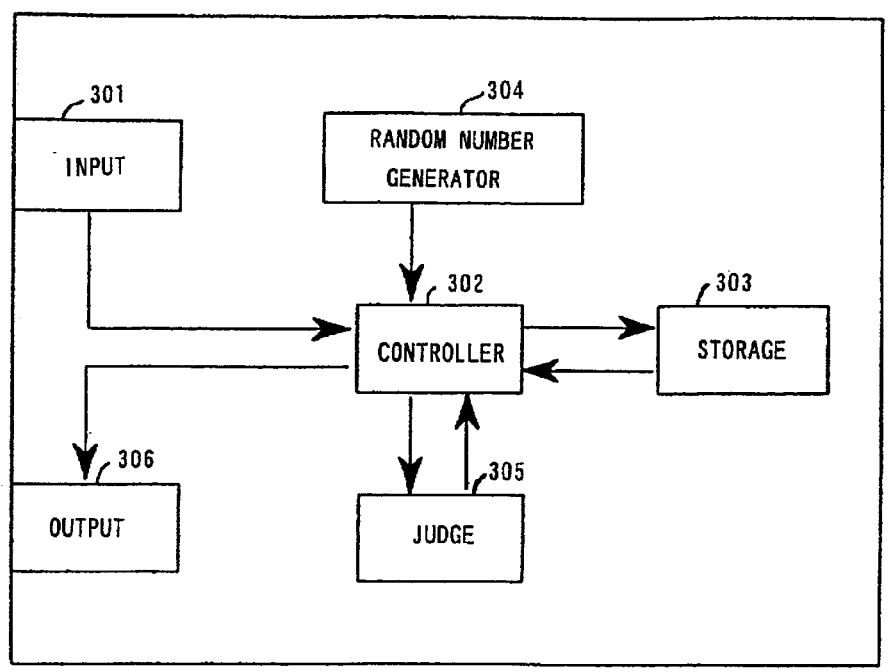
FIG. 7 is a block diagram that shows configuration of the information storage device according to the embodiment of the invention.

FIG. 7 is a block diagram of the entire configuration of the information storage device according to the embodiment. In FIG. 7, reference numeral 301 refers to an input means, 302 to a controller, 303 to a storage means, 304 to a random number generator, 305 to a judge means and 306 to an output means.

Input from the input means 301 is two-dimensional image data expressed by 16384-dimensional vectors as shown in FIG. 5A, for example. The input data is sent to the controller 302. The data sent to the controller 302 is once stored in the storage means 303. The controller 302 executes operation on the data in the storage means 303 storing the said data according to the algorithm shown in the flow chart of FIG. 4, such as adding a predetermined amount of information carriers, diffusing a predetermined amount of information carriers, dissipating a predetermined amount of information carriers, and so on. Upon this operation, selection of the position for addition in step S2 of FIG. 4 is executed based on a random number generated by the random number generator 304. Upon this operation, judgment in step S6 and step S8 of FIG. 4 is executed by using the judging means 305. Finally, the result of the operation is output from the output means 306.

A possible example of the input means 301 may be CCD, light-sensitive crystal (photonic crystal), or the like. An example of the storage means 303 is quantum dot devices having the structure as shown in FIG. 1. In this case, information carriers are electrons. An example of the output means 306 is CRT, or the like.

The information storage method according to the embodiment can be executed on a computer by using a recording medium programming this information storage method and readable with a computer.

As explained above, according to the embodiment, after expression of input information, more specifically an input pattern, for example, is once lost by a disturbance, more specifically by random addition of information carriers, and input pattern can be thereafter reproduced periodically, autonomically, and storage is made possible thereby. That is, unlike the conventional semiconductor memory, the embodiment enables reproduction of initial information periodically and store the input information without the need for regularly holding the initial information. Additionally, it is more advantageous for higher integration density than static RAM, and does not require refreshment unlike dynamic RAM.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

For example, although the embodiment has been explained heretofore as arranging 16384 pieces of information carrier storage means 101 in form of square lattice on a two-dimensional space, the number and locations of these information carrier storage means 101 are not limited to those proposed, and numbers or locations different from proposed ones may be used. Further, the information carrier storage means 101 may be arranged in a three-dimensional space, for example. Furthermore, although the input data used in the foregoing embodiment is two-dimensional image data, the input data need not be images, but may be any, such as characters, voices, or a series of desired control parameters, for example.

Moreover, the foregoing embodiment uses optical means for input and output of information, it is possible to employ another method, such as electrical means, for input and output of information.

As described above, in the information storage method, information storage device and recording medium according to the invention, since representation of information is reproduced autonomically and periodically after the input information is once changes with a disturbance, the initial information need not be held regularly, but it can be reproduced periodically, and they are advantageous for high-density storage as well.

What is claimed is:

1. An information storage method comprising:
  a first step of inputting information to be stored to a plurality of information carrier storage means that interact with each other, including by nonlinear diffusion of information carriers; and
  a second step of autonomically and periodically reproducing a representation of said information input in the first step after the representation of the information once changes with a disturbance;
  wherein time development of the information carriers due to the interaction between said plurality of information carrier storage means is expressed by:

$$\Delta z(r, t) = R(r, t) + D\left[\sum_{nn} f[z_{nn}(r, t)] - \sum_{nn} f[z(r, t)]\right] - D' f[z(r, t)]$$

and $$f[z(r, t)] = 1 + \frac{1}{1 + \exp[-\beta\{z(r, t) - z_0\}]}.$$

2. The information storage method according to claim 1, wherein interaction of said information carrier storage means includes dissipation of information carriers.

3. The information storage method according to claim 2 wherein said dissipation is nonlinear dissipation.

4. The information storage method according to claim 2 wherein reproducibility of representation of said information is controlled by adjusting the place and amount of said dissipation.

5. The information storage method according to claim 1 wherein said disturbance is random addition of information carriers.

6. The information storage method according to claim 1 wherein said disturbance is permutational addition of information carriers.

7. The information storage method according to claim 1 wherein said disturbance is evenness of integral values of added amounts of information carriers occurring periodically.

8. The information storage method according to claim 2 wherein the amount totaling a difference between the amount of said disturbance and the amount of said dissipation and the representation of said information does not exceed a predetermined threshold value.

9. The information storage method according to claim 1 wherein the first step inputs information carriers expressed by n-dimensional vectors (where n is a natural number) as information to n pieces of information carrier storage means distributed in an m-dimensional space (where m is a natural number) and functioning to hold information carriers of a real number value.

10. The information storage method according to claim 9 wherein said second step includes a step of adding a predetermined amount of information carriers to said information carrier storage means, then having a predetermined amount of information carriers diffused between a predetermined set of said information carrier storage means, having a predetermined amount of information carriers dissipated from said information carrier storage means, and having the diffusion and the dissipation repeated until the amount of information carriers of each said information carrier storage means reaches an equilibrium state.

11. The information storage method according to claim 9 wherein said second step includes a step of having each said information carrier storage means to diffuse information carriers to neighboring ones of said information carrier storage means.

12. An information storage device having a function of autonomically and periodically reproducing representation of input information after the representation of the information once changes due to a disturbance, comprising:
a plurality of information carrier storage means that interact with each other, including by nonlinear diffusion of information carriers; wherein time development of the information carriers due to the interaction between said plurality of information carrier storage means is expressed by:

$$\Delta z(r, t) = R(r, t) + D\left[\sum_{nn} f[z_{nn}(r, t)] - \sum_{nn} f[z(r, t)]\right] - D'f[z(r, t)]$$

and $$f[z(r, t)] = 1 + \frac{1}{1 + \exp[-\beta\{z(r, t) - z_0\}]}.$$

13. The information storage device according to claim 12, wherein interaction of said information carrier storage means includes dissipation of information carriers.

14. The information storage device according to claim 13 wherein said dissipation is nonlinear dissipation.

15. The information storage device according to claim 13 wherein reproducibility of representation of said information is controlled by adjusting the place and amount of said dissipation.

16. The information storage device according to claim 12 wherein said disturbance is random addition of information carriers.

17. The information storage device according to claim 12 wherein said disturbance is permutational addition of information carriers.

18. The information storage device according to claim 12 wherein said disturbance is evenness of integral values of added amounts of information carriers occurring periodically.

19. The information storage device according to claim 13 wherein the amount totaling a difference between the amount of said disturbance and the amount of said dissipation and the representation of said information does not exceed a predetermined threshold value.

20. The information storage device according to claim 12 wherein information carriers expressed by n-dimensional vectors (where n is a natural number) are input as information to n pieces of information carrier storage means distributed in an m-dimensional space (where m is a natural number) and functioning to hold information carriers of a real number value.

21. The information storage device according to claim 20 wherein a predetermined amount of information carriers is added to said information carrier storage means, a predetermined amount of information carriers is diffused between a predetermined set of said information carrier storage means, a predetermined amount of information carriers is dissipated from said information carrier storage means, and the diffusion and the dissipation are repeated until the amount of information carriers of each said information carrier storage means reaches an equilibrium state.

22. The information storage device according to claim 20 wherein each said information carrier storage means is controlled to diffuse information carriers to neighboring ones of said information carrier storage means.

23. An information storage device having the function of reproducing representation of input information autonomically and periodically after the representation of the information once changes due to a disturbance, comprising:
input means supplied with data expressed by n-dimensional vectors (where n is a natural number);
storage means made up of n pieces of information carrier storage means for storing data input to said input means;
control means for adding a predetermined amount of information carriers to data stored in said storage means, diffusing a predetermined amount of information carriers and dissipating a predetermined amount of information carriers;
random number generator for generating a random number and send it to said controller;
judging means for judging whether the change in amount of information carriers in each said information carrier storage means has become below a predetermined value or not; and
output means for outputting a result of arithmetic operation by said controller;
wherein time development of the information carriers due to the interaction between said n pieces of information carrier storage means is expressed by:

$$\Delta z(r, t) = R(r, t) + D\left[\sum_{nn} f[z_{nn}(r, t)] - \sum_{nn} f[z(r, t)]\right] - D'f[z(r, t)]$$

and $$f[z(r, t)] = 1 + \frac{1}{1 + \exp[-\beta\{z(r, t) - z_0\}]}.$$

24. A recording medium having recorded an information processing program so as to have it read by a computer, said program comprising:
a first step of inputting information to be stored to a plurality of information carrier storage means that interact with each other, including by nonlinear diffusion of information carriers;
a second step of autonomically and periodically reproducing a representation of information input in said first step after the representation of the information once changes due to a disturbance; and a third step of outputting information stored;

wherein time development of the information carriers due to the interaction between said plurality of information carrier storage means is expressed by:

$$\Delta z(r, t) = R(r, t) + D\left[\sum_{nn} f[z_{nn}(r, t)] - \sum_{nn} f[z(r, t)]\right] - D' f[z(r, t)]$$

and $$f[z(r, t)] = 1 + \frac{1}{1 + \exp[-\beta\{z(r, t) - z_0\}]}.$$

25. The recording medium according to claim 24, wherein interaction of said information carrier storage means includes dissipation of information carriers.

26. The recording medium according to claim 25 wherein said dissipation is nonlinear dissipation.

27. The recording medium according to claim 25 wherein reproducibility of representation of said information is controlled by adjusting the place and amount of said dissipation.

28. The recording medium according to claim 24 wherein said disturbance is random addition of information carriers.

29. The recording medium according to claim 24 wherein said disturbance is permutational addition of information carriers.

30. The recording medium according to claim 24 wherein said disturbance is evenness of integral values of added amounts of information carriers occurring periodically.

31. The recording medium according to claim 25 wherein the amount totaling a difference between the amount of said disturbance and the amount of said dissipation and the representation of said information does not exceed a predetermined threshold value.

32. The recording medium according to claim 24 wherein the first step inputs information carriers expressed by n-dimensional vectors (where n is a natural number) as information to n pieces of information carrier storage means distributed in an m-dimensional space (where m is a natural number) and functioning to hold information carriers of a real number value.

33. The recording medium according to claim 32 wherein said second step includes a step of adding a predetermined amount of information carriers to said information carrier storage means, then having a predetermined amount of information carriers diffused between a predetermined set of said information carrier storage means, having a predetermined amount of information carriers dissipated from said information carrier storage means, and having the diffusion and the dissipation repeated until the amount of information carriers of each said information carrier storage means reaches an equilibrium state.

34. The recording medium according to claim 32 wherein said second step includes a step of having each said information carrier storage means to diffuse information carriers to neighboring ones of said information carrier storage means.

* * * * *